(12) United States Patent
Agne et al.

(10) Patent No.: US 11,442,884 B2
(45) Date of Patent: Sep. 13, 2022

(54) METHOD FOR PROGRAMMING A PROGRAMMABLE GATE ARRAY IN A DISTRIBUTED COMPUTER SYSTEM

(71) Applicant: dSPACE digital signal processing and control engineering GmbH, Paderborn (DE)

(72) Inventors: Andreas Agne, Paderborn (DE); Dominik Lubeley, Paderborn (DE); Heiko Kalte, Paderborn (DE); Marc Schlenger, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 0 days.

(21) Appl. No.: 17/215,967

(22) Filed: Mar. 29, 2021

(65) Prior Publication Data
US 2021/0303501 A1 Sep. 30, 2021

(30) Foreign Application Priority Data

Mar. 27, 2020 (DE) ..................... 10 2020 108 604.0
Jun. 26, 2020 (DE) ..................... 10 2020 116 872.1

(51) Int. Cl.
*G06F 13/42* (2006.01)
(52) U.S. Cl.
CPC ...... *G06F 13/4247* (2013.01); *G06F 2213/40* (2013.01)
(58) Field of Classification Search
CPC .................. G06F 13/4247; G06F 2213/40
See application file for complete search history.

(56) References Cited

U.S. PATENT DOCUMENTS

| 7,088,132 B1* | 8/2006 | Tang ............... H03K 19/17748 326/39 |
| 7,203,842 B2* | 4/2007 | Kean ..................... G06F 21/72 713/189 |
| 7,265,578 B1* | 9/2007 | Tang ............ G01R 31/318516 326/40 |
| 7,554,357 B2* | 6/2009 | Chen ..................... G06F 30/34 326/39 |
| 9,235,425 B2* | 1/2016 | Kalte ................... G06F 9/4401 |
| 2017/0249274 A1* | 8/2017 | Trout .................... G06F 3/0688 |

* cited by examiner

*Primary Examiner* — Brian T Misiura
(74) *Attorney, Agent, or Firm* — Muncy, Geissler, Olds & Lowe, P.C.

(57) ABSTRACT

To program a first programmable gate array, for example a first FPGA, in a distributed computer system, a configuration of a first configuration logic on the first programmable gate array is provided. The first configuration logic is configured to receive a first user bitstream from a configuration software for configuring a first user logic on the first programmable gate array and to store the first user bitstream on a non-volatile memory of the first programmable gate array for the purpose of subsequently configuring a first user logic on the first programmable gate array according to the specifications from the first user bitstream. In an expansion stage of the invention, a configuration of a programming logic on the first programmable gate array is also provided for programming a second programmable gate array, which is connected to the first programmable gate array to form a daisy chain.

17 Claims, 8 Drawing Sheets

METHOD FOR PROGRAMMING A PROGRAMMABLE GATE ARRAY IN A DISTRIBUTED COMPUTER SYSTEM

This nonprovisional application claims priority under 35 U.S.C. § 119(a) to German Patent Application No. 10 2020 108 604.0, which was filed in Germany on Mar. 27, 2020 and to German Patent Application No. 10 2020 116 872.1, which was filed in Germany on Jun. 26, 2020 and which are both herein incorporated by reference.

BACKGROUND OF THE INVENTION

Field of the Invention

The present invention relates to the programming of distributed computer systems with programmable gate arrays. A programmable gate array is a chip, in which a matrix made up of configurable logic cells is stored, which are connectable to each other in an arbitrary manner with the aid of a network of interconnectable data lines, thus permitting the programming of almost any arbitrary logic circuits, which may be reprogrammed again later on. Important examples of programmable gate arrays are field programmable gate arrays (FPGAs) and complex programmable logic devices (CPLDs).

DESCRIPTION OF THE BACKGROUND ART

Due to their high adaptability to specific applications and their ability to process many processes in parallel, programmable gate arrays frequently offer a speed advantage over processors and are therefore often used in real-time applications. One example is the IOCNET bus (I/O carrier network) developed by the applicant. The ecosystem thereof comprises a large number of expansion cards fitted with FPGAs. An IOCNET system comprises a master processor, which is used as a hub for programming all peripheral components, including the FPGA expansion cards. Although FPGAs comprise dedicated interfaces for programming the FPGA, for example JTAG interfaces (Joint Test Action Group), the programming of FPGAs by the master processor takes place in IOCNET via regular data lines, which are also used for exchanging data between the master processor and the FPGA expansion card during the operation of the finally programmed computer system.

This procedure is disclosed, for example, in the patent application EP 2 977 905 A1, which corresponds to US 2016/0018465 and to US 2016/0018464, which are all herein incorporated by reference. EP 2 977 905 eliminates the need to lay additional cables for programming the FPGAs and also allows them to be programmed over great spatial distances, for which the JTAG standard, for example, is not designed. The FPGA expansion cards, however, must be natively designed for this type of programming. For example, an additional CPLD is stored on all FPGA expansion cards from the IOCNET ecosystem, which is designed solely for the purpose of receiving a bitstream from the master processor for programming the FPGA and to program the FPGA with the aid of this bitstream. Up to now, it has not been possible to integrate an FPGA from a third-party supplier, which is not correspondingly prepared for use in an IOCNET system. This means that certain customer wishes may not be met, for which no suitable FPGA expansion card is provided in the IOCNET ecosystem.

SUMMARY OF THE INVENTION

It is therefore an object of the present invention to improve the adaptability of FPGAs to different requirements more completely and from a central instance of programmable distributed computer systems.

To achieve the object, a first configuration logic, which is configurable on a programmable gate array, is proposed, which is configured to receive a first user bitstream at a data interface of a first programmable gate array for the purpose of configuring a first user logic on the first programmable gate array and storing it in a non-volatile memory of the first programmable gate array provided for storing a bitstream. The method according to the invention comprises a configuration of the first configuration logic on the first programmable gate array.

A user logic can be understood to be an arbitrary logic circuit configured on a programmable gate array, which is designed to process data in a manner desired by a user of the computer system.

The method according to the invention provides for the provision of a configuration software, which is configured for programming peripheral programmable gate arrays in the computer system. One example of a configuration software of this type is the ConfigurationDesk software available from the applicant. The method further comprises the integration of the first programmable gate array into the periphery of the computer system. The configuration logic is advantageously already configured on the first programmable gate array at the time of the integration.

The first programmable gate array should include a first non-volatile memory for storing at least one bitstream defining a logic circuit on the first programmable gate array. Regardless of whether the first non-volatile memory is integrated into the first programmable gate array or is situated outside of it, the first programmable gate array must be designed to read out a bitstream from the first non-volatile memory and configure a logic circuit on the first programmable gate array according to the specifications of the read-out bitstream.

The method comprises a transmission of the first user bitstream from the configuration software to the first configuration logic configured on the first programmable gate array via at least one data line of the computer system and the storage of the first user bitstream on the first non-volatile memory by the first configuration logic. The method furthermore includes the configuration of the first user logic on the first programmable gate array with the aid of the first user bitstream.

The first configuration logic may, in principle, be configured on any programmable gate array which provides logic cells with the resources needed for this purpose. A programmable gate array, on which the first configuration logic is initially configured, is programmable with the aid of a data line present at a data interface of the programmable gate array without using a dedicated programming interface of the first programmable gate array for this purpose. The present invention thereby makes it possible to integrate a programmable gate array of a third-party supplier into an IOCNET system or a technically correspondingly designed standard, which provides the programming of peripheral programmable gate arrays via data interfaces. As a further advantage, the invention also enables hardware resources to be conserved, since a further instance for programming the programmable gate array does not need to be provided on an expansion card having a programmable gate array, for example a CPLD as described above, on which a configuration logic is configured according to the present invention. Of course, it must be ensured that the configuration logic is configured each time the computer system is booted up. One way to implement this technically is presented in the description below.

The configuration of a configuration logic on a programmable gate array is known from the patent publication US 2007/0182445 A1, which is incorporated herein by reference, however only for programming programmable gate arrays connected in series in a daisy chain.

The first configuration logic is advantageously the instance, which initiates the configuration of the first user logic on the first programmable gate array. In other words, after the first configuration logic has stored the first user bitstream in the first non-volatile memory, it generates a signal, which induces the first programmable gate array to configure the first user logic on the first programmable gate array with the aid of the first user bitstream. In principle, the signal may also be output by an instance other than the first configuration logic for configuring the first user logic.

To configure the first configuration logic on the first programmable gate array, an initial bitstream may be stored on the first non-volatile memory, in particular also outside the computer system, i.e. before the first programmable gate array is integrated into the periphery of the computer system, and with the aid of a dedicated programming interface of the first programmable gate array, for example a JTAG interface, which is not identical to the data interface provided for transmitting the first user bitstream.

A particular advantage results if either the first configuration logic or the initial bitstream for configuring the first configuration logic remains on the first programmable gate array after the first user logic has been configured on the first programmable gate array. The first configuration logic may be used multiple times so that the first programmable gate array, which is provided with the first configuration logic on a one-time basis, may be repeatedly integrated into the periphery of the computer system and may be repeatedly programmed after being integrated into the periphery.

The initial bitstream can remain in the first non-volatile memory after the first user logic is configured. To store the initial bitstream in parallel to the first user bitstream, two logically separated memory slots may be provided in the non-volatile memory, the initial bitstream remaining in a first memory slot and the first user bitstream remaining in a second memory slot of the first non-volatile memory. For this purpose, the first programmable gate array should be designed to read out a bitstream from either a first or a second memory slot of the first non-volatile memory and to configure a logic circuit on the first programmable gate array according to the specifications of the bitstream read out in each case.

The first programmable gate array can be configured to automatically read out the bitstream stored in the first memory slot after the computer system is switched on, in particular after a supply voltage is applied to the first programmable gate array, and to configure a logic circuit on the first programmable gate array according to the specifications of the bitstream stored in the first memory slot. The first configuration logic can be configured to store the first user bitstream in the second memory slot, and the first user bitstream is, of course, also loaded from the second memory slot for configuring the first user logic, regardless of whether the first configuration logic or another instance of the computer system initiates the configuration of the first user logic.

A monitoring logic can be configured on the first programmable gate array along with the first user logic. The monitoring logic can be configured to monitor the input data fed from the computer system into the first programmable gate array and to detect a reset command in the input data for the purpose of reconfiguring the first programmable gate array. If the configuration software transmits a reset command to the monitoring logic with the aid of at least one data line of the computer system, the monitoring logic places the first programmable gate array into an initial state, in which the first configuration logic on the first programmable gate array is configured to receive a new user bitstream from the configuration software for configuring a new user logic on the first programmable gate array and to store it on the first non-volatile memory.

The monitoring logic can be integrated into the first user logic, so that, by configuring the first user logic on the first programmable gate array, the monitoring logic is also configured on the first programmable gate array, and the monitoring logic thereby remains on the first programmable gate array after the first user logic is configured. The monitoring logic may be stored for this purpose as a finished module in a programming environment for programmable gate arrays, for example in the form of a block for the Simulink programming environment from The MathWorks, to enable a user to easily integrate the first monitoring logic into a user logic.

The monitoring logic may be designed to induce a reconfiguration of the first configuration logic, based on the initial bitstream stored in the first memory slot. The first monitoring logic may alternatively be identical to the first configuration logic, in the sense that the functionality of the first monitoring logic is integrated into the first configuration logic, and the first configuration logic remains with the first monitoring logic integrated therein after the first user logic is configured on the first programmable gate array. In this case, the provision of two separate memory slots for separately storing the initial bitstream and the user logic may be dispensed with.

The first programmable gate array is advantageously configured to automatically configure the first configuration logic on the first programmable gate array with the aid of the initial bitstream after the computer system is switched on.

The method particularly advantageously comprises an integration of a second programmable gate array into the periphery of the computer system, which comprises a second non-volatile memory for storing at least one bitstream defining a logic circuit on the second programmable gate array, and which is designed to read out a bitstream from the second non-volatile memory and to configure a logic circuit on the second programmable gate array according to the specifications of the read-out bitstream.

A second configuration logic is configured on the second programmable gate array. The second configuration logic is configured to receive a second user bitstream for configuring a second user logic on the second programmable gate array and to store it on the non-volatile memory.

A programing logic is configured on the first programmable gate array. The programming logic is configured to receive the second user bitstream from the configuration software and to transmit it to the second configuration logic with the aid of at least one data line of the computer system. The configuration logic transmits the second user bitstream to the programming logic, and the programming logic transmits the second user bitstream to the second configuration logic before the first user logic is configured on the first programmable gate array. The second configuration logic stores the second user bitstream in the second non-volatile memory for configuring the second user logic on the second programmable gate array.

It is thus provided, in this example, that at least one programmable gate array passes at least one user bitstream on to a further series-connected programmable gate array, with the aid of the programming logic, each series-connected programmable gate array being, of course, configurable in the same way for the purpose of configuring at least one further, also series-connected, programmable gate array. With the aid of the programming logic, therefore, a daisy chain may be configured from a plurality of programmable gate arrays, integrated into the computer system and programmed according to the invention.

A daisy chain can be understood to be a series arrangement of bus participants, in which no participant apart from the first link in the series has direct access to the bus, but instead data is passed on from one participant to the following participant in each case. For example, cf. the definition on page 81 of the reference book "Digitale Schnittstellen und Bussysteme: Einführung für das technische Studium" (Digital Interfaces and Bus Systems: An Introduction for Technical Study) by Friedrich Wittgruber, Verlag Vieweg, 2nd edition (2002).

The programming logic may also be configured to read out an item of status data from the second programmable gate array before the transmission of the second user bitstream and, after the configuration of the second user logic on the second programmable gate array is completed, to restore a status of the second programmable gate array defined by the item of status data. The item of status data may be, in particular, a bus address of the second programmable gate array.

The programming logic may, of course, also be identical to the first configuration logic, in the sense that the functionality of the programming logic is integrated into the first configuration logic. The first and the second configuration logic are particularly advantageously identical in terms of their technical functionalities, so that a single module for generating an initial bitstream is available to a user, on the basis of which a logic circuit may be configured on each programmable gate array in the daisy chain, which has at least the functionality of the first configuration logic, in particular also the first monitoring logic and/or the programming logic.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
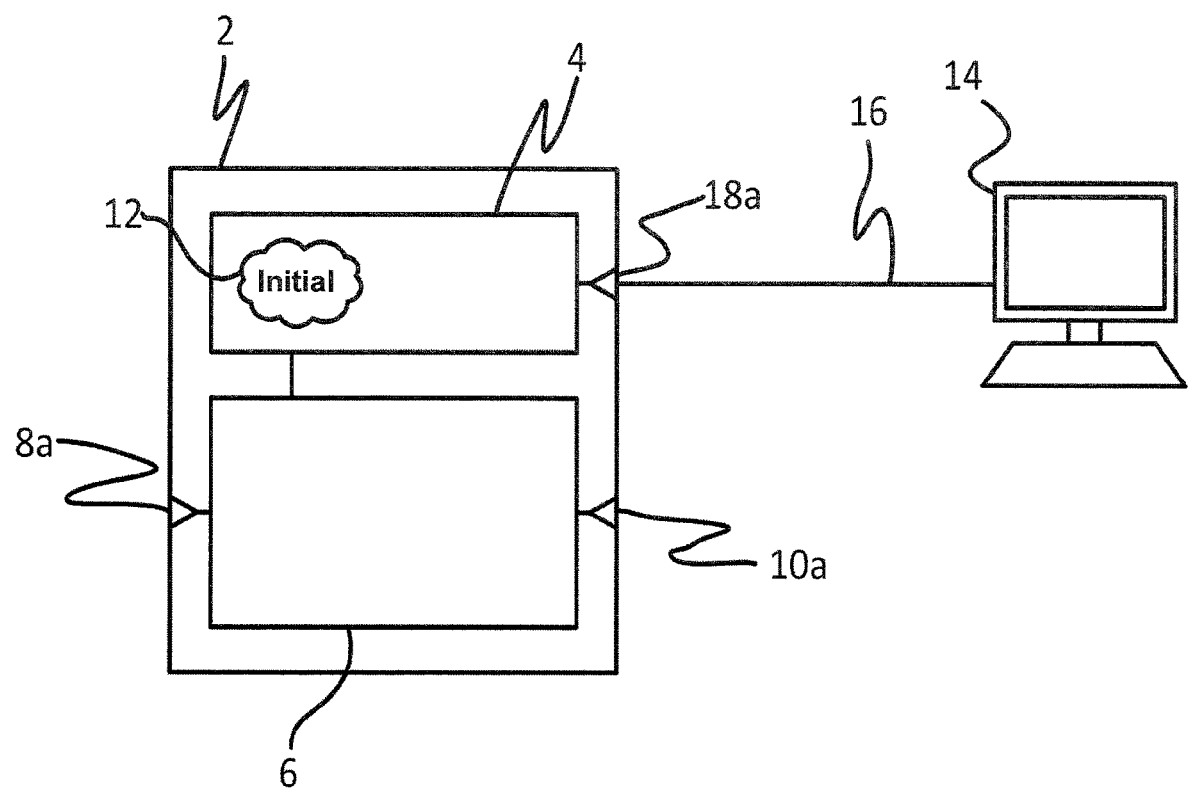
FIG. 1 shows a configuration of an initial bitstream on an FPGA.

The illustration in FIG. 1 shows a first FPGA 2, including a first matrix 6, made up of configurable and interconnectable logic cells, and a first non-volatile memory 4 designed as a flash memory, on which a bitstream may be stored for configuring a logic circuit on first matrix 6. First FPGA 2 is natively configured to read out a bitstream from first non-volatile memory 4 as a result of a signal and to configure a logic circuit on first matrix 6 according to the specifications from the read-out bitstream. The signal may be generated by an instance arranged outside first FPGA 2, for example a master processor of a distributed computer system, as well as by a logic circuit configured on first matrix 6. First FPGA 2 is also configured to automatically read out a bitstream from first non-volatile memory 4 after the application of a supply voltage to first FPGA 2 and to configure a logic circuit on first matrix 6 according to the specifications from the read-out bitstream.

First FPGA 2 comprises a programming interface 18a designed according to the JTAG standard for storing a bitstream on first non-volatile memory 4, also a plurality of data interfaces, of which a first data interface 8a and a second data interface 10a are representatively illustrated, for the purpose of exchanging data between a logic circuit configured on first matrix 6 and a periphery of first FPGA 2.

A computer 14 is connected to programming interface 18a with the aid of a JTAG cable 16 for the purpose of storing an initial bitstream 12 on first non-volatile memory 4 as the first step for the programming according to the invention of first FPGA 2. The initial bitstream is designed to configure a first configuration logic 20a on first matrix 6.

Figure 2:
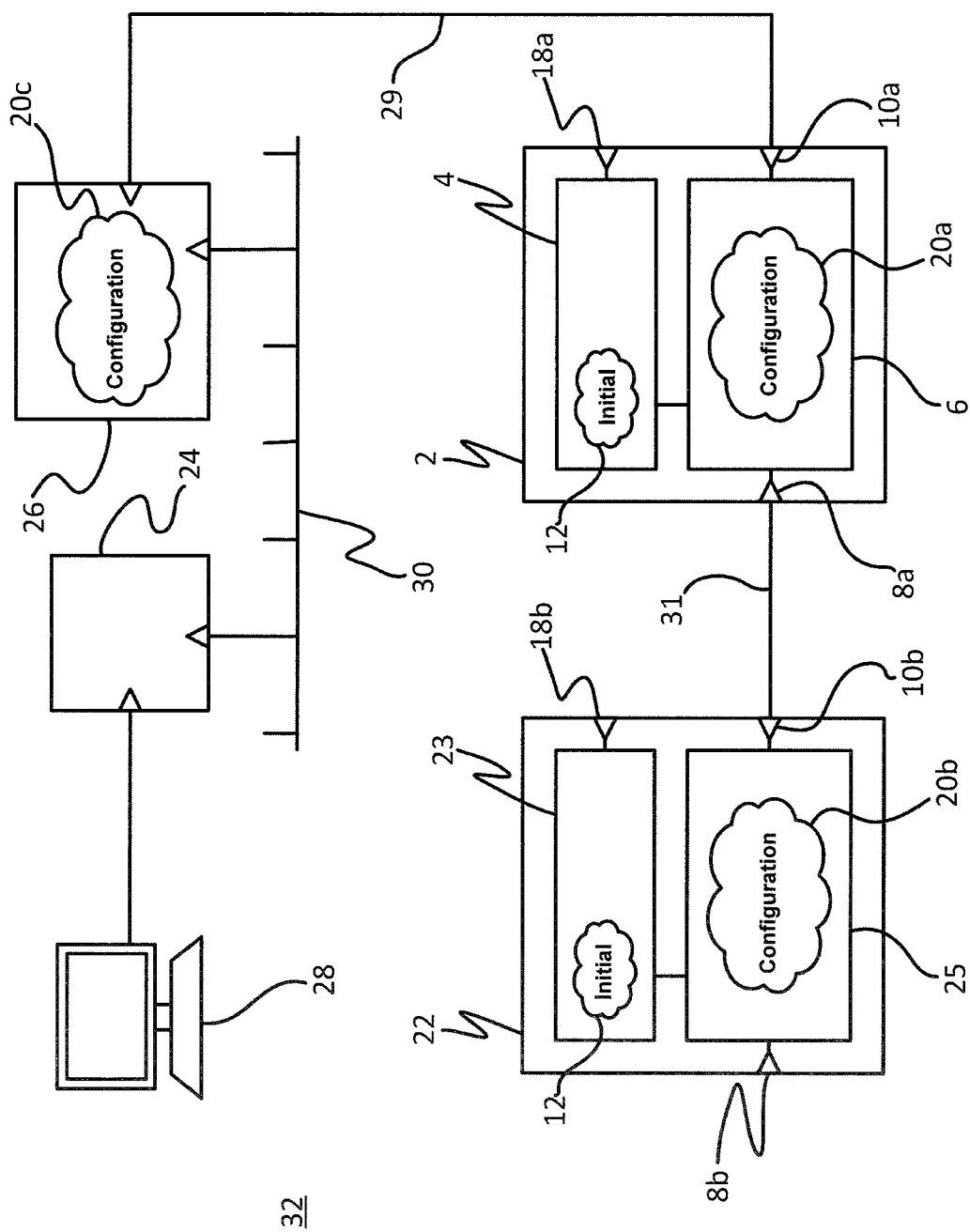
FIG. 2 shows a daisy chain made up of FPGAs configured with the initial bitstream in a distributed computer system.

First FPGA 2 is configured for integration into a distributed computer system 32 by storing initial bitstream 12 on first non-volatile memory 4. The illustration in FIG. 2 shows a set-up and booted, but not yet fully programmed, distributed computer system 32, into which first FPGA 2 and a second FPGA 22 configured in the same way are integrated as peripheral components. Computer system 32 comprises master processor 24, an FPGA expansion card 26 and a bus 30 for exchanging data between master processor 24 and peripheral components of computer system 32 and for peripheral components of computer system 32 to exchange data between each other.

Computer system 32 is designed according to the IOC-NET standard. Accordingly, master processor 24 is provided for carrying out the initial programming of the peripheral components of computer system 32. An FPGA programmable by master processor 24 is mounted on FPGA expansion card 26.

Bus 30 is used to transmit all data exchanged between master processor 24 and FPGA expansion card 26, which includes not only the user data exchanged during operation but also the bitstream transmitted from master processor 24 to FPGA expansion card 26 for programming FPGA expansion card 26. The programming of the FPGA expansion card thus takes place via the same bus 30 which is also used to transmit user data. Although the FPGA on FPGA expansion card 26 may comprise a dedicated programming interface, the latter, if present, is not involved in programming the FPGA. FPGA expansion card 26 is part of the IOCNET ecosystem and is therefore natively configured for this type of programming. In addition to the aforementioned FPGA, a further chip is also mounted on FPGA expansion card 26, for example a CPLD, which is configured to receive the bitstream for programming the FPGA from master processor 28 and to program the FPGA.

An operator computer 28 is connected to master processor 24 via an interface of computer system 32. Operator computer 28 is a commercial personal computer, on which is installed a configuration software for programming computer system 32, i.e. the master processor and all peripheral components of the computer system 32, with the aid of master processor 24. The configuration software is configured to provide the user with an overview of all programmable peripheral components of the computer system and to transmit to master processor 24 a specification designed by the user for programming the peripheral components of computer system 32.

First FPGA 2 from FIG. 1 is also integrated into the periphery of computer system 32. First FPGA 2 is purchased from a third-party supplier and, unlike FPGA expansion card 26, is not connectable to bus 30 and is not natively configured for a programming by master processor 24, as described above. Instead, second data interface 10a of first FPGA 2 is connected to a data interface of FPGA expansion card 26 with the aid of a first data cable connection 29. Since computer system 32 is already booted up, and a supply voltage is therefore applied to first FPGA 2, first FPGA 2 has automatically configured a first configuration logic 20a on first matrix 6 according to the specifications of initial bitstream 12.

Second FPGA 22 comprises a second non-volatile memory 23 and a second matrix 25 made up of configurable and interconnectable logic cells. Second FPGA 22 is designed to be identical to first FPGA 2, at least with respect to the described properties of first FPGA 2, and comprises in the same way a dedicated programming interface 18b, a first data interface 8b and a second data interface 10b. The same initial bitstream 12 that is stored on first non-volatile memory 4 of first FPGA 2 is also stored on second non-volatile memory 23, and, after the application of a supply voltage upon booting up computer system 32, second FPGA 22 has configured a second configuration logic 20b on second matrix 25, which is identical to first configuration logic 20a with regard to its functionality. Second FPGA 22 is also purchased from a third-party supplier and is not able to be integrated directly into bus 30 or natively configured for a programming by master processor 24. Second data interface 10b of second FPGA 22 is connected to first data interface 8a of first FPGA 2 with the aid of a second data cable connection 31, so that FPGA expansion card 26, first FPGA 2 and second FPGA 22 form a daisy chain within computer system 32, whose first link is FPGA expansion card 26, FPGA expansion card 26 connecting all subsequent links of the daisy chain to bus 30.

As mentioned above, first configuration logic 20a and second configuration logic 20b are designed to be identical with regard to their functionality. Firstly, they are both designed to receive a user bitstream via particular second data interface 10a, 10b, to save it to first non-volatile memory 4 or second non-volatile memory 22 and, after the conclusion of the storage of the user bitstream, to generate a suitable signal for configuring a user logic according to the specifications of the user bitstream. Secondly, they are both designed to receive a user bitstream, which is provided for configuring a subsequent FPGA in the daisy chain via particular second data interface 10a, 10b and to pass it on to the next FPGA in the daisy chain, if present, via particular first data interface 8a, 8b.

To be able to integrate more than one FPGA of a third-party supplier into the daisy chain, each configuration logic must, of course, detect whether a user bitstream is destined for a subsequent FPGA in the daisy chain for its own FPGA. A detection of this type may be implemented in different ways:

A unique identifier, for example a bus address, which may be read out by the configuration logic, may be stored on each FPGA, for example by setting a register, and master processor 24 or the configuration software is configured to add the appropriate identifier in each case to a user bitstream as an item of header data. Each configuration logic is configured to compare the identifier added to a user bitstream to the identifier of its respective own FPGA, to store the user bitstream in the non-volatile memory in the case of a match, and to forward the user bitstream in the absence of a match.

Master processor 24 may also be configured to provide each user bitstream with a piece of routing information, from which a router, which a user bitstream passes on its way through bus 30, is able to read out a router port for forwarding the user bitstream. In this example, a corresponding router functionality for configuration logics 20a, 20b must be implemented in initial bitstream 12. Each configuration logic may be designed to forward a user bitstream to the subsequent FPGA in the daisy chain, if it detects a corresponding piece of routing information, and to store the user bitstream in its own non-volatile memory 4, 23 if it does not detect a piece of routing information for forwarding the user bitstream.

A third configuration logic 20c is configured on FPGA expansion card 26. Third configuration logic 20c may be identical to first configuration logic 20a and second configuration logic 20b. Third configuration logic 20c may, however, also be designed as a simplified configuration logic 20c, whose functionality is limited to receiving a user bitstream from bus 30 and to forwarding it via first data cable connection 29 and, after completely programming computer system 32, to forwarding user data from bus 30 to first data cable connection 29 and back again, both of which may, of course, also comprise the translation of a user bitstream into a suitable protocol for first data cable connection 29. FPGA expansion card 26 thus takes on the function of a gateway for connecting first FPGA 2 and second FPGA 22 to bus 30 by the configuration of third configuration logic 20c.

Third configuration logic 20c is programmed by master processor 24 on FPGA expansion card 26 in the regular way with the aid of bus 30, as is provided at the time of the application for expansion cards which are part of the IOCNET ecosystem. A storage of an initial bitstream 12 on FPGA expansion card 26, as described above with reference to FIG. 1, is not necessary.

By configuring first configuration logic 20a on first FPGA 2 and second configuration logic 20b on second FPGA 22, first FPGA 2 and second FPGA 22 are configured for programming by master processor 24. First FPGA 2 and second FPGA 22 may be represented to a user as programmable participants of bus 30 in the configuration software on operator computer 28, just like regular bus participants, for example FPGA expansion card 26, are represented. Alternatively, first FPGA 2 and second FPGA 22 may be represented to the user in the configuration software as integral resources of FPGA expansion card 26.

Figure 3:
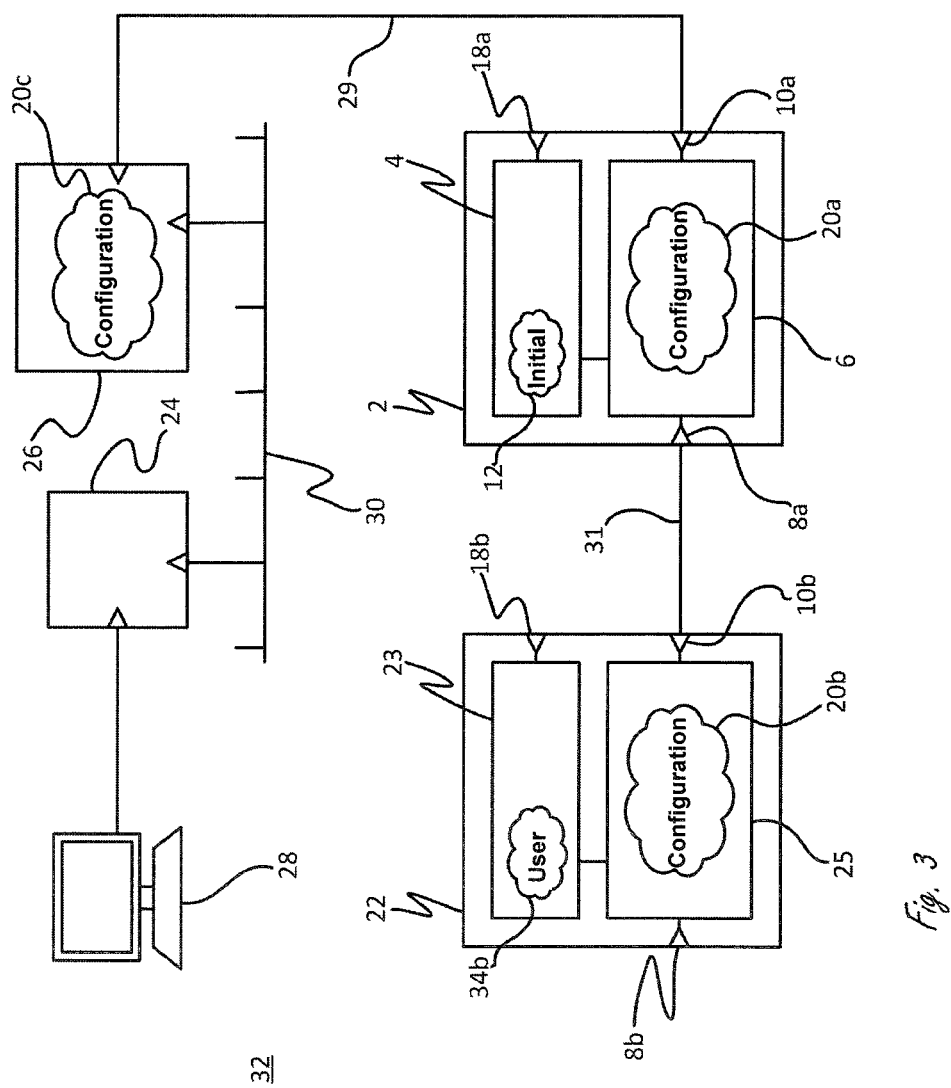
FIG. 3 shows the computer system at the beginning of the programming of the FPGAs.

The illustration in FIG. 3 shows the first step for programming first FPGA 2 and second FPGA 22. Master processor 24 programs the last link in the daisy chain first, i.e. second FPGA 22. For this purpose, master processor 24 transmits a second user bitstream 34b provided for second FPGA 22 with the aid of bus 30 to FPGA expansion card 26, which forwards second user bitstream 34b to first configuration logic 20a. First configuration logic 20a checks whether second user bitstream 34b is provided for first FPGA 2, detects that this is not the case, and consequently forwards second user bitstream 34b to second configuration logic 20b. The second configuration logic checks whether second user bitstream 34b is provided for second FPGA 22, detects that this is the case, and consequently stores second user bitstream 34b in second non-volatile memory 23.

Upon conclusion of the storage of second user bitstream 34b in second non-volatile memory 23, second configuration logic 20b generates a signal, which induces second FPGA 22 to configure a second user logic 36b on second matrix 25 according to the specifications of second user bitstream 34b. Second configuration logic 20b is overwritten.

Figure 4:
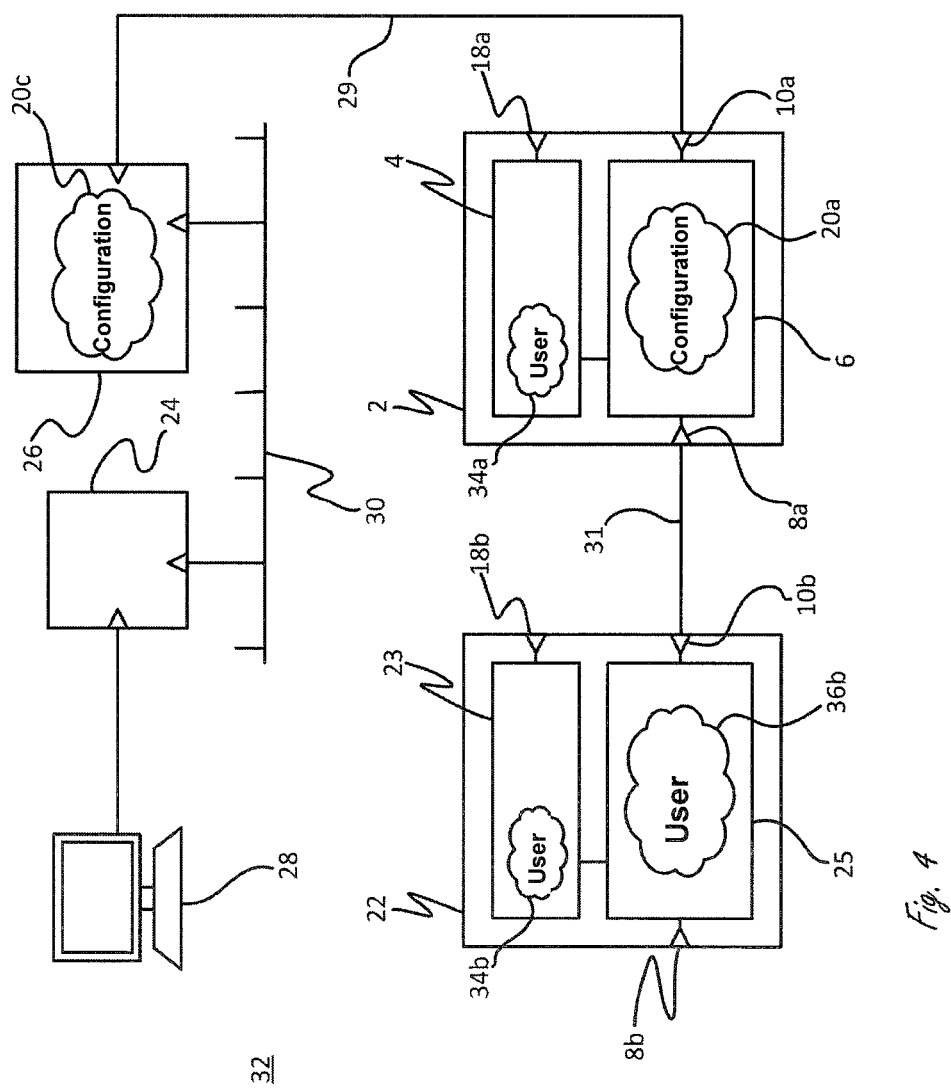
FIG. 4 shows the computer system in an advanced stage of the programming.

The illustration in FIG. 4 shows computer system 32 in an advanced stage of the programming. The configuration of second user logic 36b on second matrix 25, and thus the programming of second FPGA 22, is completed. Master processor 24 subsequently sends a first user bitstream 34a to third configuration logic 20c, third configuration logic 20c forwards first user bitstream 34a to first configuration logic 20a. The first configuration logic checks whether first user bitstream 34a is provided for first FPGA 2, detects that this is the case, and subsequently stores first user bitstream 34a in first non-volatile memory 4. Upon conclusion of the storage of first user bitstream 34a in first non-volatile memory 4, first configuration logic 20a generates a signal, which induces first FPGA 2 to configure a first user logic 36a on first matrix 6 according to the specifications of first user bitstream 34a. First configuration logic 20a is overwritten.

Figure 5:
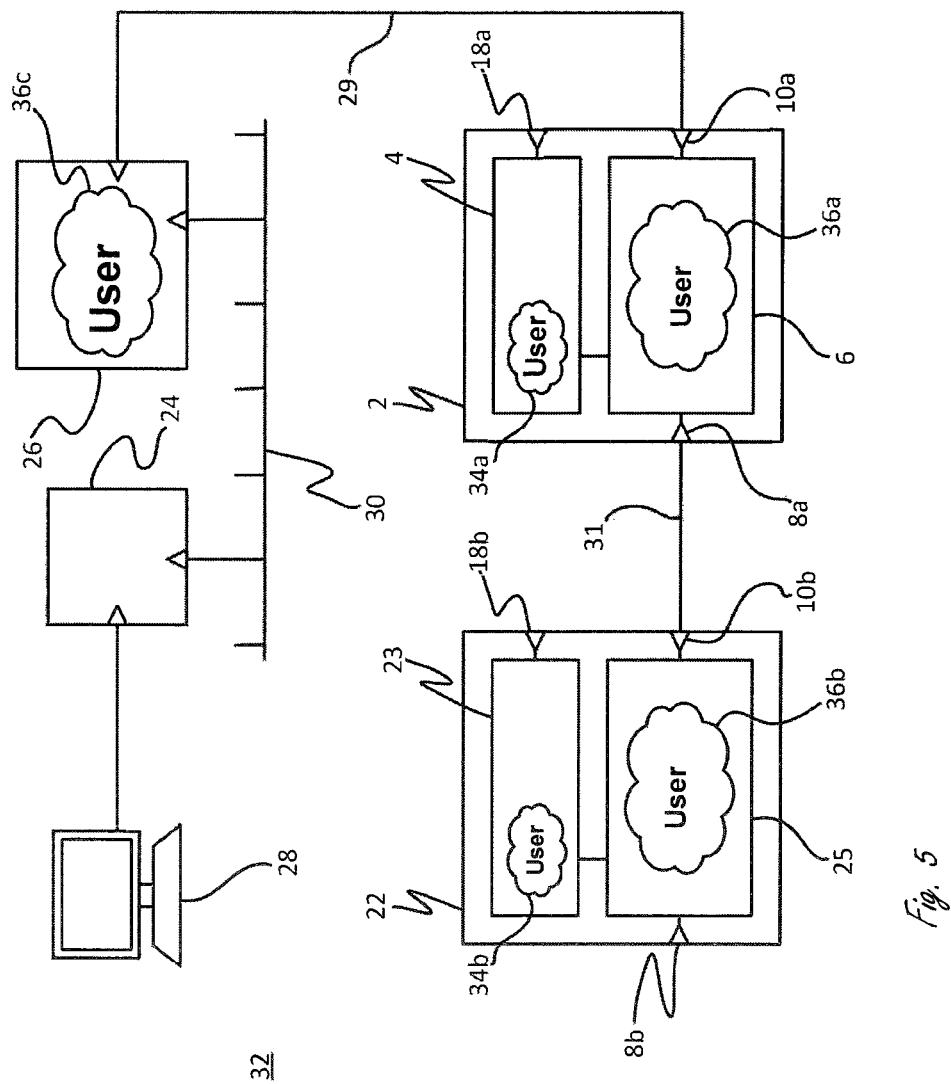
FIG. 5 shows the computer system upon conclusion of the programming of the computer system.

The illustration in FIG. 5 shows completely programmed computer system 32. After first user logic 36a has been configured on first FPGA 2 and all links of the daisy chain have thus been programmed, the master processor then configures a third user logic 36c on FPGA expansion card 26 in the usual way.

It should be noted that the representation of a three-link daisy chain in the illustrations is only an example. In principle, an arbitrary number of programmable gate arrays may be integrated into computer system 32 and programmed in a manner similar to that described above. The last link in the daisy chain is always programmed first, followed by the last still unprogrammed programmable gate array in each case in sequence. In this way, it is ensured that each programmable gate array arranged farther to the front in the daisy chain is configured for forwarding a user bitstream during the programming of computer system 32.

Figure 6:
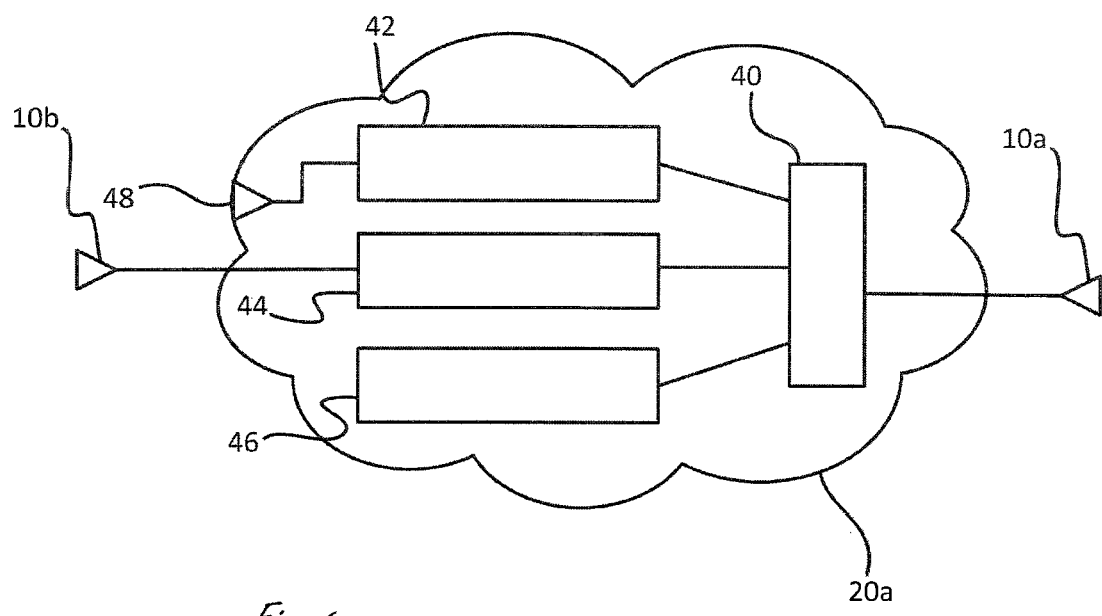
FIG. 6 shows a logic structure of a configuration logic.

The illustration in FIG. 6 summarizes an example of the logic structure of first configuration logic 20a, second configuration logic 20b having the identical configuration as first configuration logic 20a, i.e. it has the same functionality.

First configuration logic 20a comprises a monitoring logic 40, which is connected to first data interface 10a of first FPGA 2 via a logic interface of first configuration logic 20a, whereby first configuration logic 20a is configured to read in data from first data interface 10a and transmit data to FPGA expansion card 26 via first data cable connection 29. Monitoring logic 40 is configured as a multiplexer, which connects first data interface 10a to either a user interface logic 42, a programming logic 44 or a reset logic 46. Monitoring logic 40 is configured to check all data incoming via data interface 10a, as explained above, to then check whether it is provided for its own FPGA, i.e. first FPGA 2, or for another programmable gate array in the daisy chain.

Monitoring logic 40 forwards all data provided for another link of the daisy chain, user bitstreams as well as user data, to programming logic 44. Programming logic 44 is connected to second data interface 10b via a logic interface of first configuration logic 20a and is configured to forward the data received by monitoring logic 40 to the subsequent link in the daisy chain, i.e. second FPGA 22, via second data cable connection 31. The operation also works in the opposite direction: Programming logic 44 is configured to read in user data transmitted from second data interface 10b of second FPGA 22 and to forward it to monitoring logic 40. Monitoring logic 40 checks the user data received from programming logic 44. If it is provided for first FPGA 2, monitoring logic 40 forwards the user data to user interface logic 42. Otherwise, it forwards the user data to first data interface 10a, where it is forwarded to FPGA expansion card 26 via first data cable connection 29.

User data which monitoring logic 40 receives from programming logic 44 or first data interface 10a, and which is destined for first FPGA 2, is transmitted by monitoring logic 40 to user interface logic 42. User interface logic 42 is configured to provide user data transmitted by monitoring logic 40 to a user interface 48 of first configuration logic 20a, at which the user data may be read out by first user logic 36a. Conversely, user interface logic 42 is configured to read out user data provided by first user logic 36 at user interface 48 and to transmit it to monitoring logic 40.

Master processor 24 is configured to transmit a reset command to monitoring logic 40 upon an input of a user for the purpose of configuring first FPGA 2 after configuring first user logic 26a on the first matrix 6 for reprogramming it with a new user logic. Monitoring logic 40 is configured to detect a reset command and to subsequently check each reset command to see whether the reset command is provided for first FPGA 2 or for another FPGA. The monitoring logic 40 transmits reset commands which are not provided for first FPGA 2 to programming logic 44 for forwarding to second FPGA 22. The detection of a reset command provided for first FPGA 2 induces monitoring logic 40 to subsequently forward data arriving at first data interface 10a to reset logic 46. First FPGA 2 is thereby configured for receiving a new user bitstream for reprogramming first FPGA 2.

Reset logic 46 is configured to store a user bitstream received from monitoring logic 40 in first non-volatile memory 4 and, after successful completion of the storage, to transmit a checksum of the stored user bitstream to monitoring logic 40. Monitoring logic 40 transmits the checksum to master processor 24. Master processor 24 checks the correctness of the checksum and, if the checksum is correct, transmits a reprogramming command provided for first FPGA 2 to monitoring logic 40. Monitoring logic 40 transmits the reprogramming command to reset logic 46. As a result of receiving the reprogramming command, reset logic 46 sends a sequence of commands to an ICAP (internal configuration access port) of first FPGA 2, which, in its entirety, induces first FPGA 2 to initiate a reset, read out the user bitstream from first non-volatile memory 4 and configure a user logic on first matrix 6 according to the specifications from the user bitstream.

To make the programming of computer system 32 more efficient, reset logic 46 also stores the checksum in first non-volatile memory 4. Upon receiving a new user bitstream later on, it compares the checksum of the new user bitstream with the checksum stored in first non-volatile memory 4 and, if they match, does not initiate a reprogramming of first FPGA 2.

Before initiating the reset, reset logic 46 is also configured to transmit at least one item of status data, in particular a bus address of first FPGA 2, to monitoring logic 40 for forwarding to a preceding configuration logic in the daisy chain. As a result, the programming logic is configured to receive at least one item of status data from second configuration logic 20b, to store it and to restore a status of second FPGA 22 defined by the item of status data after a reprogramming of second FPGA 22.

Many of the functionalities of first configuration logic 20a described above presuppose, of course, that first configuration logic 20a remains configured after the configuration of first user logic 36a on first FPGA 2, even though the configuration of first user logic 36a overwrites first configuration logic 20a. These include, above all, the possibilities of integrating second FPGA 22 into the daisy chain and the possibility of reprogramming first FPGA 2 after completing the programming of computer system 32 according to FIG. 5. The illustrations in FIGS. 7 and 8 summarize two different possibilities for ensuring that first configuration logic 20a remains on first FPGA 2.

Figure 7:
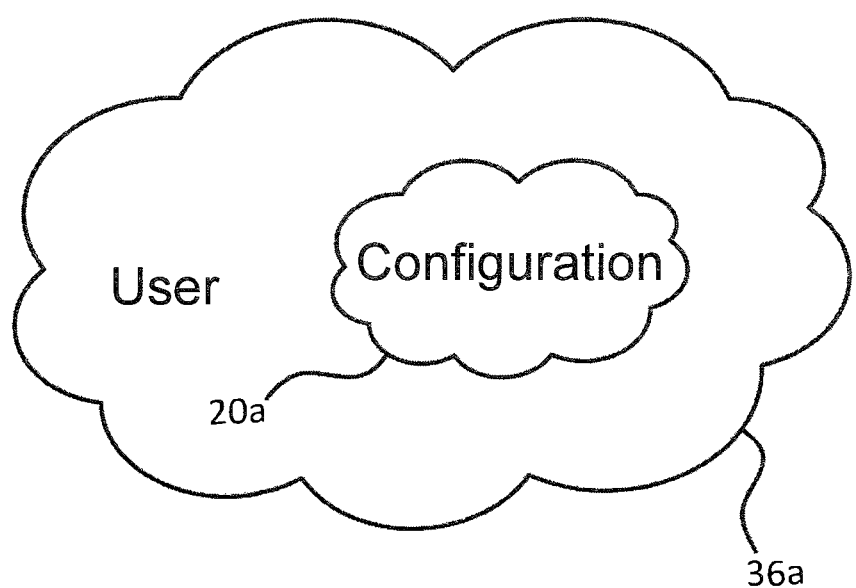
FIG. 7 shows a first procedure for storing a configuration logic on the FPGA after the programming of the computer system.

One possibility is to integrate first configuration logic 20a into first user logic 36a, as shown in the illustration in FIG. 7. First user logic 36a is thus designed in such a way that first configuration logic 36a is an integral part of the functional scope of first user logic 36a, so that first configuration logic 20a is overwritten upon the configuration of first user logic 36a on first matrix 6 but is immediately reconfigured during the course of configuring first user logic 36a. The integration of first configuration logic 20a into first user logic 36a may be left up to the user who programs first user logic 36a. First configuration logic 20a is advantageously made available to the user as a finished module which may be easily integrated into first user logic 36a.

Figure 8:
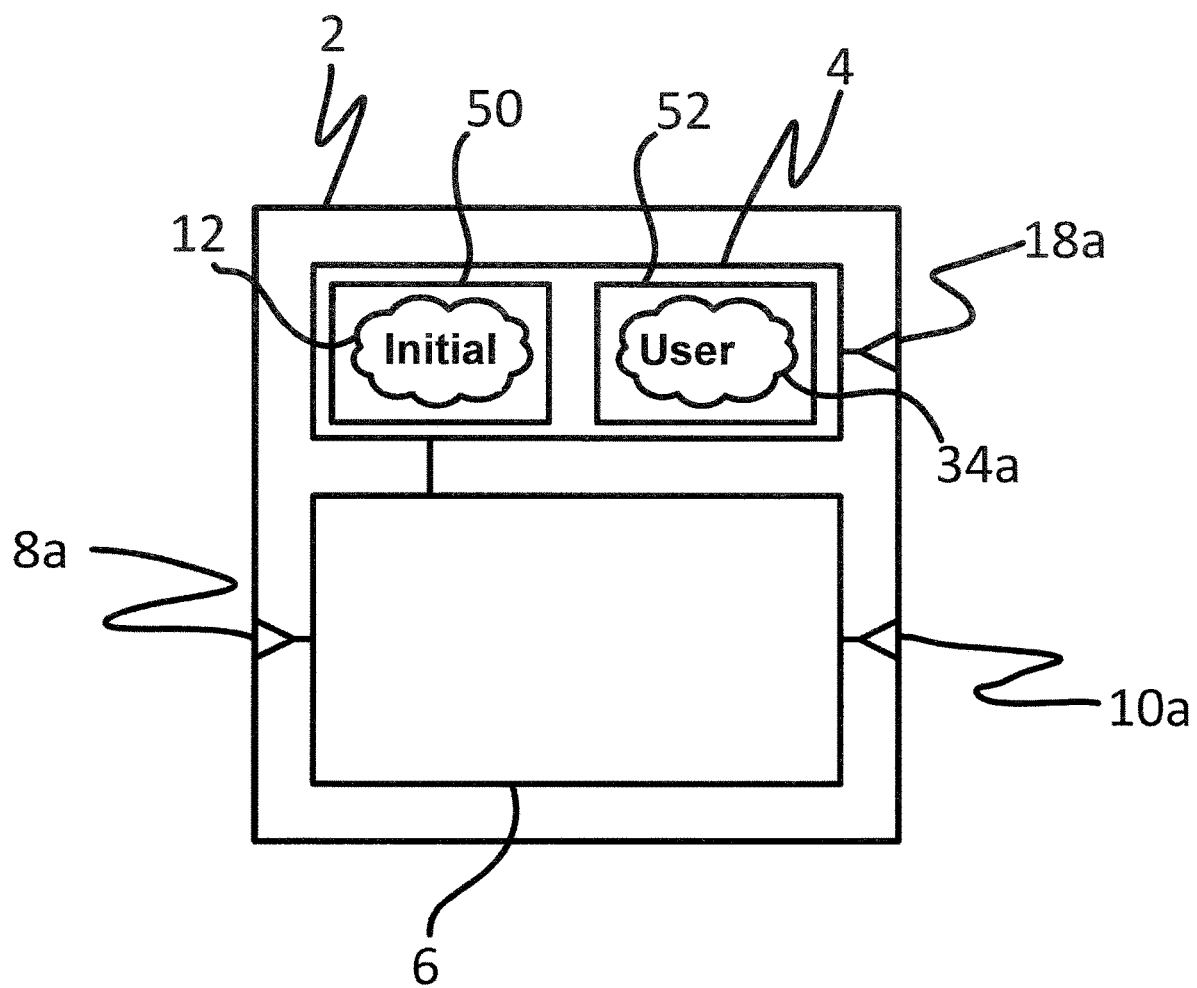
FIG. 8 shows a second procedure for storing a configuration logic on the FPGA after the programming of the computer system.

A second possibility is shown in the illustration in FIG. 8. A first memory slot 50 and a second memory slot 52, which is logically separated from the first memory slot 50, are configured in first non-volatile memory 4 of first FPGA 2. When preparing first FPGA 2 according to FIG. 1, initial bitstream 12 is stored in first memory slot 50, and first FPGA 2 is configured to automatically read out a bitstream from first memory slot 50 after the application of a supply voltage to first FPGA 2 and to configure a logic circuit on first matrix 6 according to the specifications from the read-out bitstream, so that first configuration logic 20a is configured on first matrix 6 after computer system 32 is booted up.

In this example of the invention, first configuration logic 20a is configured to store first user bitstream 34a received from the configuration software in second memory slot 52 and to generate a sequence of commands which, in their entirety, induce first FPGA 2 to initiate a reset, read out first user bitstream 34a from second memory slot 52 and configure first user logic 36a on first matrix 6 according to the specifications from first user bitstream 34a.

First memory slot 50 is thus provided solely for storing initial bitstream 12, so that the operation of configuring first configuration logic 20a by booting up computer system 32 may be repeated an arbitrary number of times. This example of the invention is advantageous in that it does not require an integration of first configuration logic 20a into first user logic 36a. Firstly, more resources on first matrix 6 are therefore available to the user for designing first user logic 36a, and secondly, the user may work with a prefabricated first user logic 36a, into which no configuration logic is integrated and whose design may no longer be modified by the user. To integrate further programmable gate arrays into the daisy chain, however, at least functionalities of programming logic 44 must be configured on first matrix 6 for the purpose of forwarding user data and user bitstreams to other programmable gate arrays and to receive them from other programmable gate arrays. Otherwise, only one single programmable gate array of a third-party supplier may be integrated into the daisy chain.

It is understood that the procedure described in connection with FIGS. 7 and 8 may be applied in the same way to second FPGA 22 and to any further programmable gate arrays integrated into the daisy chain.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for programming at least one programmable gate array in a distributed computer system, the method comprising:
providing configuration software for programming peripheral programmable gate arrays in the computer system;
integrating a first programmable gate array into a periphery of the computer system, the first programmable gate array being adapted to read out a bitstream from a first non-volatile memory and to configure a logic circuit on the first programmable gate array according to the specifications of the read-out bitstream;
providing a configuration, on the first programmable gate array, of a first configuration logic, which is configured to receive a first user bitstream from the configuration software for configuring a first user logic on the first programmable gate array, and to store the first user bitstream on the first non-volatile memory;
transmitting a first user bitstream from the configuration software to the first configuration logic via at least one data line of the computer system;
storing the first user bitstream on the first non-volatile memory by the first configuration logic;
configuring the first user logic on the first programmable gate array with the aid of the first user bitstream;
configuring, along with the first user logic, a monitoring logic on the first programmable gate array, which is configured to monitor input data fed into the first programmable gate array by the computer system and to detect a reset command in the input data for reconfiguring the first programmable gate array;
transmitting the reset command from the configuration software to the monitoring logic via at least one data line of the computer system; and
restoring an initial state, in which the first configuration logic on the first programmable gate array is configured to receive a new user bitstream from the configuration software for configuring a new user logic on the first programmable gate array and to store it on the first non-volatile memory by the monitoring logic as a result of the detection of the reset command.

2. The method according to claim 1, wherein the first configuration logic initiates the configuration of the first user logic.

3. The method according to claim 1,
wherein an initial bitstream for configuring the first configuration logic on the first programmable gate array is stored on the first non-volatile memory via a dedicated programming interface of the first programmable gate array or a JTAG interface, and
wherein the first user bitstream is transmitted to the first configuration logic with the aid of a data interface of the first programmable gate array, which is not identical to the dedicated programming interface.

4. The method according to claim 1, wherein the first configuration logic or the initial bitstream remains on the first programmable gate array after the configuration of the first user logic.

5. The method according to claim 4,
wherein the initial bitstream remains in a first memory slot of the first non-volatile memory and the first user bitstream remains in a second memory slot of the first non-volatile memory,
wherein the first programmable gate array reads out a bitstream from either the first memory slot or the second memory slot and configures a logic circuit on the first programmable gate array according to the specifications of the read-out bitstream, and
wherein the first programmable gate array is configured to automatically read out the bitstream stored in the first memory slot and to configure a logic circuit on the first programmable gate array according to the specifications of the bitstream stored in the first memory slot.

6. The method according to claim 1, wherein the monitoring logic is identical to the first configuration logic.

7. The method according to claim 1, wherein the first programmable gate array is configured to automatically configure the first configuration logic on the first programmable gate array via the initial bitstream after the computer system is switched on.

8. The method according to claim 1, further comprising:
integrating a second programmable gate array into the periphery of the computer system, the second programmable gate array being designed to read out a bitstream from a second non-volatile memory and to configure a logic circuit on the second programmable gate array according to the specifications of the read-out bitstream;
configuring, on the second programmable gate array, a second configuration logic, which is configured to receive a second user bitstream for configuring a second user logic on the second programmable gate array and to store it on the second non-volatile memory;
configuring, on the first programmable gate array, a programming logic, which is configured to receive the second user bitstream from the configuration software and to transmit it to the second configuration logic via at least one data line of the computer system;
transmitting the second user bitstream from the configuration software to the programming logic;
transmitting the second user bitstream from the programming logic to the second configuration logic before the first user logic is configured on the first programmable gate array; and
configuring the second user logic on the second programmable gate array with the aid of the second user bitstream.

9. The method according to claim 8, further comprising:
reading in at least one item of status data or a bus address, of the second programmable gate array by the programming logic;
restoring a status defined by the item of status data of the second programmable gate array by the programming logic after the second user logic is configured on the second programmable gate array.

10. The method according to claim 8, wherein the programming logic is identical to the first configuration logic.

11. The method according to claim 8, wherein the first configuration logic and the second configuration logic are identical with regard to their functionalities.

12. A non-transitory storage medium storing therein an initial bitstream of a programmable gate array to configure a logic circuit on the programmable gate array, which implements a configuration logic configured to carry out a method comprising:
receiving a configuration software for programming the programmable gate array;
receiving a user bitstream at a data interface of the programmable gate array for configuring a user logic on the programmable gate array;
storing the user bitstream on a non-volatile memory of the programmable gate array;
configuring the user logic on the programmable gate array via the user bitstream;
configuring, along with the user logic, a monitoring logic on the programmable gate array, which is configured to monitor input data fed into the programmable gate array by a computer system and to detect a reset command in the input data for reconfiguring the programmable gate array;
transmitting the reset command from the configuration software to the monitoring logic via at least one data line of a computer system; and
restoring an initial state, in which the configuration logic on the programmable gate array is configured to receive a new user bitstream from the configuration software for configuring a new user logic on the programmable gate array and to store it on the non-volatile memory by the monitoring logic as a result of the detection of the reset command.

13. The non-transitory storage medium according to claim 12, wherein the method carried out by the configuration logic further comprises:
generating the initial bitstream in a programming environment for programming programmable gate arrays, designed as a block which is integratable into a graphical program.

14. A method for programming at least one programmable gate array in a distributed computer system, the method comprising:
providing configuration software for programming peripheral programmable gate arrays in the computer system;
integrating a first programmable gate array into a periphery of the computer system, the first programmable gate array being adapted to read out a bitstream from a first non-volatile memory and to configure a logic circuit on the first programmable gate array according to the specifications of the read-out bitstream;
providing a configuration, on the first programmable gate array, of a first configuration logic, which is configured to receive a first user bitstream from the configuration software for configuring a first user logic on the first programmable gate array, and to store the first user bitstream on the first non-volatile memory;

transmitting a first user bitstream from the configuration software to the first configuration logic via at least one data line of the computer system;

storing the first user bitstream on the first non-volatile memory by the first configuration logic;

configuring the first user logic on the first programmable gate array with the aid of the first user bitstream;

integrating a second programmable gate array into the periphery of the computer system, the second programmable gate array being designed to read out a bitstream from a second non-volatile memory and to configure a logic circuit on the second programmable gate array according to the specifications of the read-out bitstream;

configuring, on the second programmable gate array, a second configuration logic, which is configured to receive a second user bitstream for configuring a second user logic on the second programmable gate array and to store it on the second non-volatile memory;

configuring, on the first programmable gate array, a programming logic, which is configured to receive the second user bitstream from the configuration software and to transmit it to the second configuration logic via at least one data line of the computer system;

transmitting the second user bitstream from the configuration software to the programming logic;

transmitting the second user bitstream from the programming logic to the second configuration logic before the first user logic is configured on the first programmable gate array; and configuring the second user logic on the second programmable gate array with the aid of the second user bitstream.

15. The method according to claim 14, further comprising:

reading in at least one item of status data or a bus address, of the second programmable gate array by the programming logic;

restoring a status defined by the item of status data of the second programmable gate array by the programming logic after the second user logic is configured on the second programmable gate array.

16. The method according to claim 14, wherein the programming logic is identical to the first configuration logic.

17. The method according to claim 14, wherein the first configuration logic and the second configuration logic are identical with regard to their functionalities.

* * * * *